(12) United States Patent
Burggraf

(10) Patent No.: US 12,482,678 B2
(45) Date of Patent: Nov. 25, 2025

(54) APPARATUS WITH DEFORMABLE HEATER AND METHOD FOR HEATING A SUBSTRATE THEREOF

(71) Applicant: EV Group E. Thallner GmbH, St. Florian am Inn (AT)

(72) Inventor: Jürgen Burggraf, Schärding (AT)

(73) Assignee: EV GROUP E. THALLNER GMBH, St. Florian Am Inn (AT)

( * ) Notice: Subject to any disclaimer, the term of this patent is extended or adjusted under 35 U.S.C. 154(b) by 860 days.

(21) Appl. No.: 17/778,476

(22) PCT Filed: Dec. 2, 2019

(86) PCT No.: PCT/EP2019/083342
§ 371 (c)(1),
(2) Date: May 20, 2022

(87) PCT Pub. No.: WO2021/110238
PCT Pub. Date: Jun. 10, 2021

(65) Prior Publication Data
US 2022/0415675 A1 Dec. 29, 2022

(51) Int. Cl.
*H01L 21/67* (2006.01)
*H01L 21/324* (2006.01)

(52) U.S. Cl.
CPC ...... *H01L 21/67103* (2013.01); *H01L 21/324* (2013.01); *H01L 21/67092* (2013.01)

(58) Field of Classification Search
CPC ............. H01L 21/67103; H01L 21/324; H01L 21/67092; H01L 21/185; H01L 21/67109; H01L 21/6838; H01L 21/67288; H01L 21/68785
See application file for complete search history.

(56) References Cited

U.S. PATENT DOCUMENTS

| | | |
|---|---|---|
| 5,685,363 A | 11/1997 | Orihira et al. |
| 8,206,525 B2 | 6/2012 | Izumi |
| 2008/0017627 A1 | 1/2008 | Iwata et al. |
| 2009/0317960 A1* | 12/2009 | Izumi ................ H01L 21/67092 438/455 |

(Continued)

FOREIGN PATENT DOCUMENTS

| | | |
|---|---|---|
| CN | 109496345 A | 3/2019 |
| JP | 2006-210372 A | 8/2006 |

(Continued)

OTHER PUBLICATIONS

Search Report issued in Singapore Patent Application No. 11202204818V dated May 9, 2025.
(Continued)

*Primary Examiner* — John P. Dulka
(74) *Attorney, Agent, or Firm* — RENNER, OTTO, BOISSELLE & SKLAR, LLP

(57) ABSTRACT

Apparatus and method for heating a substrate. The apparatus including a heater and a substrate holder with a substrate holder surface, wherein the substrate to be heated can be placed on the substrate holder surface, the apparatus further includes means for exerting forces on the heater, the apparatus further includes a control unit for controlling the means, wherein the heater is deformable by the means.

20 Claims, 2 Drawing Sheets

(56) References Cited

U.S. PATENT DOCUMENTS

| | | |
|---|---|---|
| 2011/0287560 A1 | 11/2011 | Chew et al. |
| 2012/0234454 A1 | 9/2012 | Izumi |
| 2013/0175005 A1 | 7/2013 | Gowdaru et al. |
| 2020/0027768 A1 | 1/2020 | Zinner et al. |

FOREIGN PATENT DOCUMENTS

| | | | |
|---|---|---|---|
| JP | 2006222124 A * | 8/2006 | ....... H01L 21/67109 |
| JP | WO2008001626 A1 | 1/2008 | |
| JP | 2009-218536 A | 9/2009 | |
| WO | WO2012/083978 A1 | 6/2012 | |
| WO | WO2019/057286 A1 | 3/2019 | |

OTHER PUBLICATIONS

Written Opinion issued in Singapore Patent Application No. 11202204818V dated May 13, 2025.

International Search Report from corresponding International Patent Application No. PCT/EP19/83342, dated Aug. 11, 2020.

First Office Action issued in corresponding Chinese Patent Application No. 201980102572.1 dated Feb. 15, 2025.

* cited by examiner

APPARATUS WITH DEFORMABLE HEATER AND METHOD FOR HEATING A SUBSTRATE THEREOF

FIELD OF INVENTION

The present invention relates to an apparatus and method for heating and for processing a substrate.

BACKGROUND OF INVENTION

In the semiconductor industry, heaters are needed to help make it possible to heat substrates and substrate stacks relatively quickly and efficiently. The heaters are needed in various technological areas. For example, it would be conceivable to use them in imprint lithography to heat a substrate with the embossing compound deposited thereon, in particular to cure the embossing compound. Another conceivable application is the use of heaters in a bonding apparatus. A bonding apparatus is used to bond two substrates to each other temporarily or permanently. The heat introduced via the heater can be used to generate the energy required for a metal diffusion bond. It is also conceivable for the heat to be used to reduce the viscosity of an adhesive. A further possible use of a heater would be to implement it in a debonding apparatus, the purpose of which is to separate temporarily bonded substrates from each other again.

In the following text, the word substrate will also be used as a synonym for substrate stack, that is to say for at least two substrates positioned one on top of the other. The apparatuses according to the invention are preferably bonders, in particular thermocompression bonders. In these apparatuses, substrate stacks or at least two substrates positioned one on top of the other which have not necessarily been fixed yet, are bonded to each other. However, since the text and figures only show the bottom part of such an apparatus for the sake of simplicity, this simplified description was chosen.

Various types of substrate holders are known in the related art, whose task includes fixing substrates of different sizes and shapes in place. These substrate holders may be equipped with an integrated heater. The task of the heater is to heat the substrate holder and consequently the substrate fixed on the holder. In most cases, the heater is not located directly in the replaceable substrate holder, but rather in the mounting for the substrate holder. The heater is thus a part of the corresponding apparatus, whereas substrate holders can be replaced.

One problem of the substrate holders described in the related art is that the heater is unable to create optimal, homogeneous temperature distribution in a fixed substrate or substrate stack. The heat produced by the heater must always pass through parts of the heater and through the substrate holder before heating the substrate. Over the length of this path, different heat flows may leave the primary heat flow in different directions and at different rates. The end result is a generally inhomogeneous or at least a very poorly quasi-homogeneous temperature distribution in the substrate or substrate stack. It is even conceivable that the substrate or substrate stack may itself allow thermal anisotropy and dissipate the incoming heat at different rates and speeds in different directions, which can also lead to undesirable effects.

A further problem is the usually very high pressure load to which the heater is exposed in some apparatuses. Particularly in bonding apparatuses, extremely strong forces and pressures act on the substrates and thus also on the substrate holder and the stage on which the substrate holder is fixed. This mechanical load then acts on the heater inside the stage as well. These external forces and pressures cause an undesirable deformation of the heater and can have a detrimental effect on heating behaviour.

In extremely rare cases, an entire process chamber is brought to temperature. In most cases, a substrate holder is warmed with the aid of a heater, in particular a surface heater. Heaters of this kind are very compact but relatively heavy components. Since the electrical current required for heating is quite large, they mostly are comprised of thick coils. Of course, heaters which are comprised of multiple, particularly symmetrically distributed heating elements, particularly such that can be actuated individually are also conceivable. One document that describes such an apparatus is WO2012083978A. The disadvantage in this case is that actuation of this nature also entails a correspondingly complicated control system.

SUMMARY OF INVENTION

The present invention provides an apparatus and a method which at least partially, and in particular completely eliminate the described drawbacks of the related art. In particular, an object of the present invention to provide an apparatus and a method with which it is possible to produce a desired temperature distribution on a surface, in particular a substrate surface.

The temperature distribution is preferably homogeneous, but in principle may be modulated in any way necessary. Additionally, an apparatus and method are to be described with the aid of which it is possible to compensate for and/or offset an undesirable deformation of the heater.

This problem is solved with the features of the independent claim(s). Advantageous further developments of the invention are presented in the dependent claim(s). The scope of the invention also encompasses all combinations of at least two of the features presented in the description, the claims and/or the drawings. Where value ranges are specified, values within the stated limits are also to be considered disclosed as limit values and claimable in any combination.

In the following text, the terms substrate and substrate stack are used synonymously. In particular, a substrate may also be comprised of a plurality of substrates that are also arranged preferably side by side on a substrate holder for processing.

Accordingly, the invention relates to an apparatus for heating a substrate, which includes a heater and a substrate holder with a substrate holder surface, wherein the substrate to be heated is placeable on the substrate holder surface, the apparatus is further equipped with means for applying forces to the heater, the apparatus is also equipped with a control unit for controlling the means, wherein the heater is deformable by the means.

The invention further relates to a method for heating a substrate, in particular for generating a predetermined target temperature distribution in a substrate and/or for compensating for a deformation of the heater due to external forces, preferably with the apparatus described previously, wherein a heater heats the substrate and a substrate holder holds the substrate on a substrate holder surface, wherein means apply forces to the heater, and wherein the means are controlled by a control unit, and wherein the heater is deformed by the means.

The invention further relates to an apparatus for processing and/or bonding a substrate, wherein the apparatus comprises the equipment for heating described above.

The invention further relates to a method for processing and/or bonding a substrate, wherein the substrate is heated by the method for heating described above.

In a preferred embodiment of the invention, it is provided that as a result of the deformation of the heater by the means (change of shape and/or local as well as global positions of individual surface sections of the heater), an actual temperature distribution of the substrate is adjustable/adjusted to a target temperature distribution. In this way, the setting of a desired temperature distribution of the substrate is advantageously enabled by a mechanical deformation of the heater. In particular, a cumbersome and complicated actuation of individual heating elements of the heater may be dispensed with.

In another preferred embodiment of the invention, it is provided that because of the deformation of the heater by the means it is possible to offset a deformation of the heater due to external forces. In this way, it is possible to offset an undesirable deformation of the heater. In this context, the external forces are not the forces which the means exert on the heater. In particular, an undesirable deformation of the heater is understood to mean a deformation that takes place as a consequence of a bonding process. This undesirable deformation, caused by external forces, may also be offset before, during or after a pressure load is applied to the substrate. The undesirable deformation of the heater may occur when the pressure load is applied to the substrate. Through targeted deformation of the heater by the means, this undesirable deformation may be offset and/or compensated, at least reduced. In this way, the undesirable deformation of the heater may advantageously be offset. For example, the heater may be deformed in such a way that the heater, in particular individual surface sections of the heater surface, takes up a desired position in the stage and/or takes up a desired position for the heating of the substrate. Particularly advantageously, the capability of actively changing the shape of a heater may make it possible to compensate for and/or reverse an undesirable deformation of the heater caused by a pressurising device. In particular, compensation of the undesirable deformation of the heater by a pressure load then also results in a more homogeneous temperature distribution.

In another advantageous embodiment of the invention, it is provided that the heater can be deformed/is deformed in targeted manner by at least one deformation element which is connected to the heater, wherein the at least one deformation element is connected to at least one actuator. In such case, the deformation element is one of the means for deformation of the heater. The heater, in particular a heater surface, is locally deformable by the deformation element, wherein a particularly targeted and desired deformation is possible through the application of pressure, tension and/or a torsional moment. A further advantageous aspect of the targeted deformation by the deformation elements includes in particular that an undesirable deformation of the heater, caused for example by the pressure load on the substrate, can be offset by the deformation elements. In such case, the undesirable deformation is the deformation which is caused by the external forces. Moreover, the heating behaviour may be influenced advantageously through the targeted deformation caused by the deformation elements.

In another advantageous embodiment of the invention, it is provided that the heater is arranged on a side of the substrate holder surface opposite the substrate. With this arrangement it is possible for the heater to be deformed in targeted manner and in particular independently of the substrate holder.

In another advantageous embodiment of the invention, it is provided that the heater is deformable/deformed independently of the substrate holder surface. This enables a desired temperature distribution to be obtained by the deformation of the heater without causing deformation of the substrate holder surface and/or the substrate. The undesirable deformation of the heater may also be compensated advantageously independently of other components.

In another, particularly preferred embodiment of the invention, it is provided that the apparatus includes a stage, wherein the substrate holder is arranged on a stage surface of the stage, and the heater is arranged inside the stage. In this way, for example, it is possible for the substrate holder to be charged with a substrate and subsequently placed and/or fixed on the stage. A further advantage includes that with this arrangement the deformation elements necessary for deformation of the heater and in particular the actuators can be arranged inside the stage, thereby providing a design advantage.

In another embodiment of the invention, it is provided that the heater has a heating element of flat construction or a plurality of heating elements in particular in a flat arrangement. A flat shape of the heater enables the heater to be deformed more easily, in particular with a weaker application of force on the heater by the deformation elements. Moreover, the area of an elastic deformation is larger with a flat heater shape than with a cubic shape, for example. The deformation of the heater effected by the means is thus possible with the application of less force and in particular may be adjusted more precisely.

In another embodiment of the invention, it is provided that at least one point of the heater can be/is fixed with at least one fixing element, wherein the fixing element is connected to the heater. Fixing elements also represent a means for deforming the heater. In this way, at least one point of the heater is not deformed and can maintain an unchanged distance from the substrate. Moreover, advantageous scenarios for deformation of the heater by the fixing element are obtained, wherein for example the fixing element is arranged in the middle of the heater and in particular further deformation elements introduce forces in an area of the heater farther from the middle.

In another embodiment of the invention, it is provided that the deformation of the heater can be/is limited by at least one support element which is not connected to the heater, wherein the at least one support element only places the heater under a pressure load. Support elements also represent a means for deforming the heater. In such case, the support elements, which are in particular of yielding construction, prevent an undesirable, in particular plastic deformation of the heater. Moreover, further deformation scenarios of the heater can be created through the arrangement of the support elements.

In another embodiment of the invention, it is provided that the deformation of the heater is/can be limited by at least one limiting element which is not connected to the heater, and/or the deformation of the heater is/can be predefined by the shape of the at least one limiting element. Limiting elements also represent a means for deformation of the heater. Limiting elements are preferably used in combination with at least one of the other elements (means) to produce a targeted deformation of the heater. Thus, an undesirable plastic deformation of the heater may be prevented by a simple constructional solution. Moreover, a simple constructional solution such as spherical limiting elements for example may also serve to predefine a shape for the deformation of the heater, wherein in particular the deformation elements press and/or pull the heater towards or away from the limiting elements, for example.

In another advantageous embodiment of the invention it is provided that a fluid stream can be/is flushed between the heater and other components, in particular between the heater and the stage and/or between the heater and the substrate holder, in particular to optimise the transfer of heat between the heater and the other components. The fluid stream enables more uniform heating of the components and in particular of the substrate holder. The thermal conductivity of the fluids is greater than 0 W/(m*K), preferably greater than 0.01 W/(m*K), more preferably greater than 0.1 W/(m*K), most preferably greater than 1 W/(m*K). The thermal conductivity of helium is in a range approximately between 0.15 W/(m*K) and 0.16 W/(m*K).

In another advantageous embodiment of the invention, it is provided that a plate is arranged on the heater, in particular on the heater surface. The plate is located above the heater and in particular has a positive effect on a temperature homogenisation. The plate is preferably made from one of the following materials materials:
Metal, in particular
copper
copper-molybdenum alloy
alloy, in particular
steel
carbon, in particular
graphite.

In another advantageous embodiment of the invention, it is provided that a heating of the substrate is carried out with the following steps, in particular in the following sequence:
  (i) Positioning and/or fixing the substrate on a substrate holder surface of a substrate holder,
  (ii) Determining an actual temperature distribution of the substrate, in particular on the substrate surface,
  (iii) On the basis of an analysis of the actual temperature distribution compared with a target temperature distribution, deforming the heater with the means, wherein the means are controlled by the control unit so that the deformation of the heater has the effect of adjusting the actual temperature distribution of the substrate in targeted manner to the predefined target temperature distribution.

In such case, the substrate may be positioned and/or fixed on a substrate holder surface of a substrate holder. Then, an actual temperature distribution of the substrate, in particular on the substrate surface, can also be calculated. Additionally, the heater is deformable on the basis of the analysis of the temperature distribution compared with a target temperature distribution, so that a change of the shape of the heater enables the actual temperature distribution of the substrate to be adjusted in targeted manner to the predefined target temperature distribution. This in turn yields the advantage for example that heating of the substrate can be carried out in several, in more efficient steps. Moreover, heating of the substrate takes place in still more precise and in particular advantageously uniform manner.

In another advantageous embodiment of the invention, it is provided that a heating of the substrate is carried out with the following steps, in particular in the following sequence:
  (i) Positioning and/or fixing the substrate on a substrate holder surface of a substrate holder,
  (ii) Determining an undesirable deformation of the heater, in particular of the heater surface,
  (iii) On the basis of an analysis of the deformation of the heater caused by the external forces, deforming the heater with the means, wherein the means are controlled by the control unit so that the deformation of the heater has the effect of offsetting the deformation of the heater caused by the external forces.

In this context, in particular the undesirable deformation of the heater, particularly such deformation as is induced by external forces as a consequence of a bonding process of the substrate, is determined by sensors or other means. The sensors or other means are preferably arranged in or on the elements. The undesirable deformation may also be determined by visual means. The deformation of the heater that actually occurs is measured. In this context, the undesirable deformation may be measured before, during or after the bonding process. A targeted deformation of the heater by the means on the basis of empirical or calculated values before the bonding process is also conceivable. The deformation of the heater preferably counteracts the undesirable deformation, so that the heater, or the heater surface, takes up a desired position. In this situation, it is also possible that only local portions of the heater are deformed. With this compensation of the undesirable deformation, it is also possible to influence the temperature distribution of the substrate positively. The calculated, undesirable deformation of the heater may then be compensated during an actual bonding process by the elements (deformation, fixing, support and/or limiting elements), with the result that the heater undergoes no deformation, or at least less deformation, particularly with respect to a desired shape of the heater. In this case, the elements are utilised primarily to correct or compensate for an undesirable deformation and all the disadvantages associated therewith.

An advantageous aspect of the invention comprises particularly in that, particularly when driven by actuators, the deformation elements make it possible to influence the shape and/or position of the heater surface, and thus also the radiation and thermal conductivity behaviour. By targeted adjustment of the radiation behaviour, it thus becomes possible to adjust the temperature distribution. In particular, this means that the use of multiple, single heating elements in the heater, which must be actuated individually, can be dispensed with. The heater preferably needs just a single heating element, particularly an element that covers the full surface or is incorporated throughout the heater, in particular a standard heating coil. However, it is also conceivable that the heater may be comprised of a plurality of heating elements in a flat arrangement.

It is a further advantageous aspect of the invention that an undesirable deformation of the heater may be offset and/or compensated by the means.

Apparatus

In particular, the invention provides for the positioning of deformation elements, driven in particular by actuators, on at least one side of a heater and to deform the heater and thus also the heating surface therewith. In this context, the heater may in particular be part of a substrate holder. The heater is preferably installed in a stage, on which the substrate holder can be mounted in fixed manner. The radiation and thermal conductivity characteristics of the heater and therewith also the temperature distribution are adapted by creating a change in the heater surface.

In this context, it may also be provided that the heater or an additional heater is arranged above the substrate. A heating surface of a heater arranged above the substrate may in particular also adapt the radiation and thermal conductivity characteristics of the heater and therewith also the temperature distribution through a change in the heater surface. In an alternative arrangement, a substrate holder fixes the substrate on a downward facing substrate holder surface in particular through suction or by a magnetic force. In such an alternative arrangement, the heater may be arranged correspondingly above the substrate holder.

An important physical aspect for the radiation characteristics of the heater surface is its roughness. The term roughness will first be defined generally. Then, a value range for the roughness of the heater surface will be specified.

In the following text, flatness serves as a measure of the perfection of a planar are, in particular a surface. Deviations from a planar surface are expressed as waviness and roughnesses. The waviness of a surface is characterized by a certain periodic rise and fall of the surface, particularly in the millimetre range, less often in the micrometre range. On the other hand, roughness is an aperiodic phenomenon in the micrometre and/or nanometre range. The exact definition of surface properties of such kind is known to all persons skilled in the arts of surface physics, tribology, machine building or material sciences. In order to deal with the various deviations from the ideal surface, in the rest of this patent specification the term "roughness" will be used synonymously with an umbrella term for all effects of such kind. The roughness is quantified as medium roughness, root mean square roughness or as average roughness depth. The calculated values for average roughness, root mean square roughness and average roughness depth generally differ for the same measurement distance or measurement area, but they lie within the same magnitude range. For this reason, the following numeric value ranges for roughness are to be understood either as values for average roughness, root mean square roughness, or average roughness depth.

The roughness of the heater surface is in particular less than 100 µm, preferably less than 10 µm, more preferably less than 1 µm, particularly preferably less than 100 nm, most preferably less than 10 nm.

In particular, the heater may be heated to a temperature above 25° C., preferably above 50° C., more preferably above 200° C., particularly preferably above 400° C., most preferably above 600° C.

The elasticity is described by the E-modulus. The E-modulus of the heater is between 1 GPa and 1000 GPa, preferably between 10 GPa and 1000 GPa, more preferably between 25 GPa and 1000 GPa, particularly preferably between 50 GPa and 1000 GPa, most preferably between 100 GPa and 1000 GPa. For example, the E-modulus of some steel types is about 200 GPa. The smaller the E-modulus of the heater is, the greater its (elastic) deformation under a predefined load. Therefore, heaters are preferably used which undergo elastic deformation relatively easily and accordingly have an E-modulus which is rather low.

There are several different technical parameters for describing hardness. The correct hardness measuring procedure depends on many influencing factors. The most important factors are the material that is to be tested, and the test piece. Metals and ceramics, that is to say solids with correspondingly high strength and/or corresponding plasticity, are most often—but not only—tested using hardness measuring procedures according to Rockwell, Brinell and Vickers. It is only possible to convert the individual hardness measurement values to a limited extent. Corresponding tables and formulas do exist and are known to the person skilled in the art. However, it must be noted that an exact conversion is not always possible, or it is inexact. The following hardness measurement values refer to Vickers hardness.

The Vickers hardness of the heater surface is greater than 100, preferably greater than 500, more preferably greater than 1000, particularly preferably greater than 5000, most preferably greater than 10000. Unalloyed steels have a Vickers hardness of a about 150 HV. Martensite has a Vickers hardness of about 1000 HV. The hardness of the heater surface is preferably as great as possible, to prevent plastic deformation, particularly on the heater surface.

The heater is preferably made from at least one of the following materials:
Metal, in particular
  Cu, Ag, Au, Al, Fe, Ni, Co, Pt, W, Cr, Pb, Ti, Ta, Zn, Sn
Ceramic, in particular
  High-performance ceramic
Alloy, in particular
  Steel.

In a preferred embodiment, the heater is located in a mounting for a substrate holder, particularly preferably in a stage. In particular, the heater is thus separated from the substrate holder.

In another embodiment, the heater is located in the substrate holder, that is to say not in the stage.

The following text will now describe various embodiments for deforming the heater. The heater is in particular a component which has a thickness in the millimetre range of the centimetre range.

In general, all apparatuses may be equipped with four types of element, (i) the fixing elements, (ii) the deformation elements, (iii) the support elements and (iv) the limiting elements. Of these, the fixing elements, the deformation elements and the support elements are intended to deform the heater. To this extent, they represent the cited means for deforming the heater.

The elements are preferably equipped with sensors, which serve to measure a force or pressure. In this context, the sensors may be arranged in or on the elements. The sensors may measure the deformation, in particular the undesirable deformation, of the heater and/or the heating surface. Particularly if the elements are to be used to compensate for an undesirable deformation of the heater due to a pressure load, it is important to determine whether the desired compensating effect will be or has been achieved. This also makes it possible for the sensors to validate and/or detect a desired changed of shape of the heater.

The main task of the fixing elements is to anchor the heater, or to fix at least one point. They are preferably positioned centrally and connected to the heater. In particular, there is preferably only one fixing element. The fixing elements are preferably not connected to actuators, but they can also be connected to actuators in order to correspondingly position the part or parts of the heater that is/are to be fixed and hold it/them in place in the desired manner.

The deformation elements are used in particular to apply force. They are in p particular connected to actuators, which are in particular extremely powerful, and are preferably fixed on the periphery of the heater. Since they are connected to the heater, they can exert tensile and compressive forces on the heater. It is also conceivable that the deformation elements introduce turningl moments, in particular torsional moments, into the heater and deform the heater. Such deformation elements, particularly torsion rods connected to corresponding actuators, are preferably also arranged on the periphery of the heater.

The support elements are preferably positioned between the fixing elements in the centre and the deformation elements on the periphery of the heater. They preferably serve to support the heater, in particular they are constructed so that they are able to yield. However, it would also be conceivable for these elements to be connected to actuators as well, in order to introduce forces locally. In particular, the support elements are able to define a maximum permitted deformation of the heater. The support elements are not connected to the heater and therefore can only apply a pressure load to it.

The limiting elements are preferably centrally aligned rings, in particular tori (Note: plural of torus) and/or spheres. In particular, the limiting elements are able to define the maximum achievable, particularly technically practical radius of curvature of the heater. The limiting elements are in particular not connected to the heater and are preferably also not connected to actuators. To this extent, the limiting elements may also be considered as means which in particular cooperate in combination with the other abovementioned elements.

The fixing elements, the deformation elements and the support elements are preferably of rod-like structure. Very many actuators, particularly linear actuators, already have rod-like pistons. For the purposes of the embodiments, these pistons might be considered fixing elements, deformation element or support elements in their own right. However, it is also conceivable that the pistons of actuators are connected to the elements.

Fixing elements and the deformation elements in particular are additionally connected to the heater.

The actuators may be mechanical, and/or electric, and/or pneumatic and/or hydraulic actuators. In particular, the actuators and/or the elements (means) may be equipped with sensors, which are able to determine the undesirable deformation of the heater. It is further conceivable that the actuators and/or the elements (means) are able to determine the external forces that act on the heater. In particular, the undesirable deformation may then be calculated on the basis of the forces, preferably by the control unit, and the actuators for deformation of the heater may be actuated by the means.

In a preferred embodiment, several deformation elements are located on the side of the heater facing away from the heating surface. The deformation elements are in particular connected to the underside of the heater symmetrically, preferably in a grid pattern. The deformation elements are in particular able to move normally to the substrate fixing surface or to the heating surface which in particular is as yet undistorted. Since the deformation elements in particular are connected to, particularly mounted on the underside of the heater, a locally determined force can be exerted on the heater. This locally applied force allows the local deformation of the heater. Through the individual actuation of all corresponding deformation elements, it is possible to set all technically feasible and desirable heater surfaces, and also to produce the temperature distributions therewith. In particular, in this way it is also possible to compensate for and/or reverse the undesirable deformations of the heater that are produced in the heater by an apparatus, particularly a bonding apparatus. The compensation of the undesirable deformation of the heater by application of a pressure load then in particular also results in a more homogeneous temperature distribution.

In another preferred embodiment, deformation elements preferably only engage at the edge of the rear side of the heater, whereas further support elements are unconnected below the heater. The unconnected support elements serve to support the heater. Although they are not connected to the heater, they are still able to exert pressure on it and deform it locally.

In another embodiment, preferably only deformation elements are arranged on the periphery of the heater, and these allow bending of the heater at the edge via correspondingly powerful actuators. At the same time, the centre of the heater is supported by at least one fixing element.

In another embodiment, elements for limiting the maximum achievable radius of curvature of the heater are arranged underneath the heater. The limiting elements are for example centrally aligned rings, in particular tori (Note: plural of torus), more preferably spheres. Deformation elements may apply tensile force to the heater, for example, wherein the limiting elements limit the curvature of the heater.

All embodiments of the apparatus may be flushed, particularly with a fluid, preferably a gas, most preferably a gas with high thermal conductivity, in order to optimise, particularly maximise, the transfer of heat between the curved heater and other components. The use of a fluid mixture, particularly a gas mixture, is also conceivable. In particular, the following fluids may be used for preference:

Gas, in particular
Noble gas, preferably
helium,
argon and/or
krypton;
Molecular gases, preferably
carbon dioxide and/or
oxygen;
Liquids, in particular
water and/or
oils.

The fluids named may be combined to form fluid mixtures. The fluid stream particularly flows over the heater surface in order to optimise heat convection between the heater and in particular the stage.

In a further embodiment, it is also possible to evacuate the space around the heater, that is to say the stage. In this context, the vacuum is below 100 mbar, preferably below $10^{-2}$ mbar, more preferably below $10^{-3}$ mbar, particularly preferably below $10^{-5}$ mbar, most preferably below $10^{-7}$ mbar.

The heater may in particular be deformed locally. In particular, global, convex and concave deformations are also possible. If one considers the centre of the heater surface when the heater is in the undeformed versus the deformed state, the absolute value of the distance between the centres is defined as curvature. The curvature may be changed by more than 1 µm, preferably more than 10 µm, more preferably more than 1 mm, particularly preferably more than 5 mm, most preferably more than 10 mm.

Method

In a first method for heating a substrate in particular with one of the previously described apparatuses, a locally resolved temperature measurement is carried out of the substrate surface, which is connected to a controller of the heater via a control loop. The objective is to set an desired, particularly homogeneous, temperature distribution. However, for many applications it may be an inhomogeneous but symmetrical temperature distribution that is desired. For example, it would be conceivable to set a radially symmetrical, inhomogeneous temperature distribution in which the temperature reaches an extremum in the centre and at the edge, and falls linearly between them. In this way, substrates may be actively extended by temperature compensation in such manner that a distortion error, also called an incoming run-out error, can be actively compensated or at least reduced before contact is made with a second substrate.

All of the following process steps can be performed in one method for heating, but it is also possible in particular for individual process steps to be omitted, and in particular the sequence of the process steps may be changed.

In a first process step of a first method, a substrate is loaded on a substrate holder and fixed. In such case, the substrate holder may already be positioned on the stage. If the substrate holder is not yet positioned on the stage, it is deposited and mounted thereon after fixing. In most cases, the substrate holder will already be mounted on the stage when the substrate is loaded and fixed.

In a second process step of a first method, a measuring system for measuring the temperature distribution is positioned on the substrate surface and/or activated and/or calibrated. It is conceivable that the measuring system for measuring the temperature distribution was already positioned and/or calibrated and/or activated before fixing of the substrate and/or the substrate holder. In this case, this process step is omitted.

In a third process step of a first method, the substrate surface is recorded with the measuring system to determine the current temperature distribution. Since the substrates are usually loaded and fixed at room temperature, and the apparatus is in thermodynamic equilibrium with the environment at this time, it may be assumed that the temperature distribution is more or less homogeneous.

In a fourth process step of a first method, the heater is activated and set to a desired temperature. Heat is now transported through the heater, the substrate holder surface, the stage, the substrate holder and the substrate.

In a fifth process step of a first method, the substrate surface is measured with the measuring system again to determine the current temperature distribution. In contrast to the third process step, this time the temperature distribution will generally be inhomogeneous. Therefore, in the fifth process step the temperature distribution is not only recorded, but also analysed in a computer system. In particular a temperature field is produced, and from this is derived a temperature gradient field.

In a sixth process step of a first method, the heater is now deformed by the deformation elements in such manner that the deformation enables the thermal radiation and/or the thermal conductivity to be adjusted so that the temperature field on the substrate surface becomes as homogeneous as possible. Now, the tuning takes place between the fourth and fifth process steps until a desired temperature distribution is obtained, in particular as homogeneous as possible.

In a further, seventh process step of a first method, the substrate undergoes further treatment. In particular, the substrate can be bonded, exposed to light for photolithography purposes, coated with an embossing compound, and the embossing compound can be embossed. Further technically constructive subsequent treatments of the substrate are conceivable.

In a second method for heating a substrate in particular with one of the previously described apparatuses, an undesirable deformation of the heater is compensated by deformation of the heater. In this context, all of the following process steps can be performed, but it is also possible in particular for individual process steps to be omitted, and in particular the sequence of the process steps may be changed.

In a first process step of a second method, a substrate is loaded on a substrate holder and fixed. In such case, the substrate holder may already be positioned on the stage. If the substrate holder is not yet positioned on the stage, it is deposited and mounted thereon after fixing. In most cases, the substrate holder will already be mounted on the stage when the substrate is loaded and fixed.

In a second process step of a second method, a pressure load is applied, in particular within a bonding apparatus, which is spreads as far as the heater and deforms it. Such an indirect and undesirable deformation of the heater takes place in particular due to application of a pressure load to the substrate or the substrate stack.

In a third process step of a second method, the undesirable deformation of the heater is captured. In this process, the undesirable deformation may be calculated in particular by sensors or other means. The deformation of the heater that actually occurred and was captured is captured in particular in the form of data and analysed. For this purpose, in particular an electronic data processing device may be used.

In a fourth process step of a second method, the heater is deformed, in particular by the elements of the apparatus. In this process, the undesirable deformation of the heater compensated, preferably completely, or at least reduced. The compensation is preferably performed by the actuatable actuators of the elements. It is also conceivable that full compensation of the deformation is not carried out, but instead the undesirable deformation of the heater is only compensated until a point at which a desired temperature and/or pressure profile is established. It is also conceivable that the deformation of the heater is known as a function of the selected bonding parameters, in particular because a previous measurement has been taken. In this case, it is not necessary to rely on sensor data during the bonding process. Compensation of the heater can also be carried out before and/or while the pressure load is applied.

Further advantages, features and particularies of the invention will be discernible from the following description of preferred embodiments and with reference to the drawing.

BRIEF DESCRIPTION OF DRAWINGS

In the figures, identical components or components with identical function are denoted with the same reference numerals.

DETAILED DESCRIPTION OF INVENTION

Figure 1A:
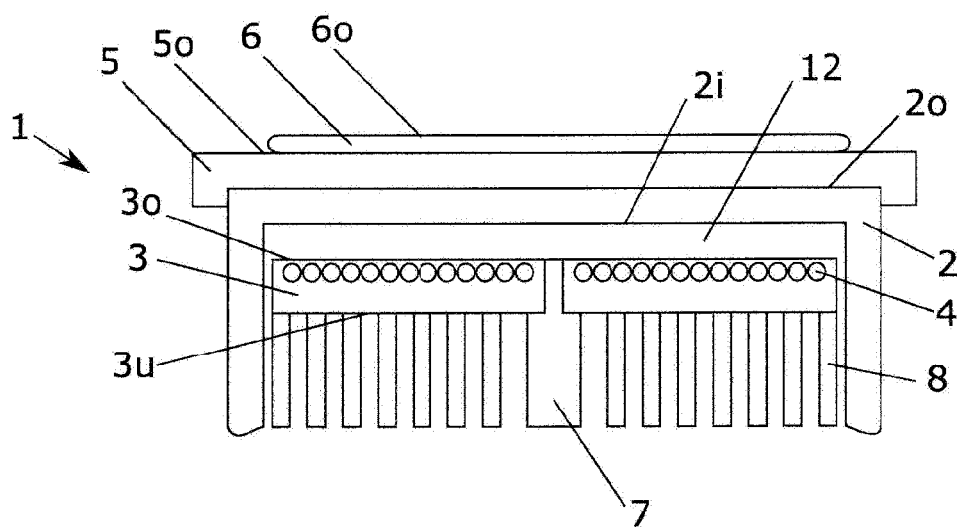
FIG. 1a shows a first embodiment of an apparatus for heating a substrate according to the invention in a passive position.

FIG. 1a shows a first embodiment of the apparatus 1 in a passive state, having a stage 2 with a stage surface 2o, wherein a heater 3 is arranged in the stage 2, and a substrate holder 5 may be mounted and/or fixed on the stage 2. The actual substrate 6 is fixed on the substrate holder 5. The heater 3 is equipped with heating elements 4, by which the heat may be generated. The technical form of the heating elements 4 is not significant for the embodiment. The heater 3 is in particular fixed at the correct height by a fixing element 7. The fixing element 7 is located in the centre, but of course it may fix the heater 3 acentrically and/or at the periphery.

In another embodiment—not shown—it is possible that the fixing element 7 extends as far as the stage 2 and is attached therein to increase the stability of the apparatus. However, for the sake of clarity such a representation is not illustrated in the figures.

The characterizing feature of the fixing element 7 comprises that at least one point of the heater 3 remains fixed under deformation, in particular it is not actively deformed. In the case of a peripheral arrangement of fixing element 7 these would be in particular multiple points in a ring. The deformation of the heater 3 is produced via deformation elements 8, which are particularly arranged symmetrically on the underside 3u of the heater 3 and are connected to the heater 3.

The figures show a relatively large open space 12 between the stage interior surface 2i and the heater surface 3o. This open space 12 was drawn to a relatively large scale in the figures in order to be able to show the deformation of the heater 3 more clearly. In some embodiments, other components may also be located in this open space 12, in particular plates for temperature homogenisation. All these components may in particular be connected to each other mechanically. When a pressure load is applied to the substrate 6, the force or pressure may be transmitted through the substrate holder 5, the stage 2 to the heater 3 and deform the heater 3. In particular, it is possible that a pressure load may cause the stage 2 and therewith the stage interior surface 2i to become deformed to such an extent that the stage interior surface 2i comes into contact with the heater surface 3o and consequently transfers the force and/or pressure to the heater 3, thereby deforming the heater 3. Particularly in case of the embodiments in which the fixing element 7 is connected mechanically to the heater 3 and the stage 2, this results in a significant deformation of the heater 3 when a pressure load is applied to the substrate. A mechanical connection between the stage 2 and the heater 3 has been deliberately omitted in the figures for the sake of clarity.

Figure 1B:
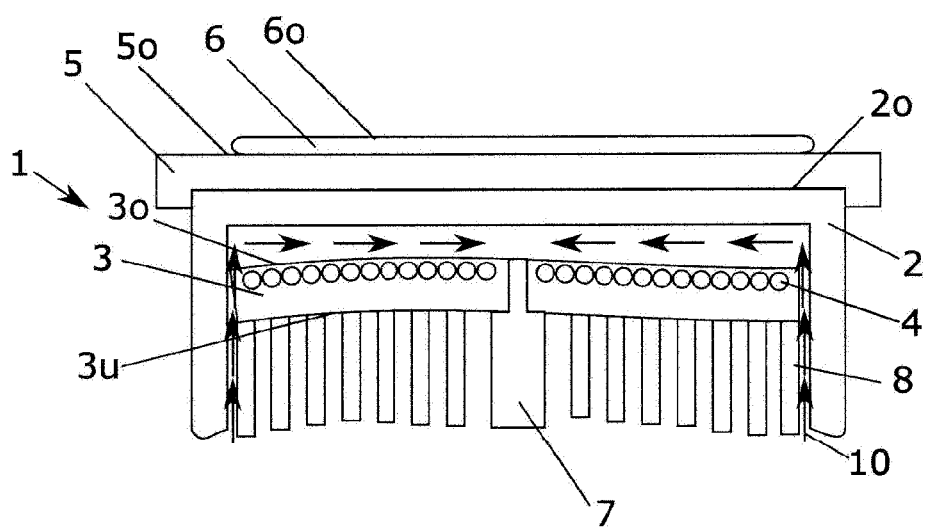
FIG. 1b shows the first embodiment of the apparatus according to the invention in an active position.

FIG. 1b shows a first embodiment of the apparatus 1 according to the invention in an active state. The deformation elements 8 are shifted according to their position in such a way that the heater surface 3o is deformed. In this case, the deformation of the heater surface 3o must take place in such a way that the temperature on the substrate holder surface 5o, preferably on the substrate surface 6o, attains the desired distribution, in particular a homogeneous distribution. Optionally, a fluid, particularly in the form of a fluid stream 10, may be introduced into the stage 2 to flow around the heater 3. Particularly the thermal convection between the heater surface 3o and the stage 2 is preferably optimised, in particular increased.

Figure 1C:
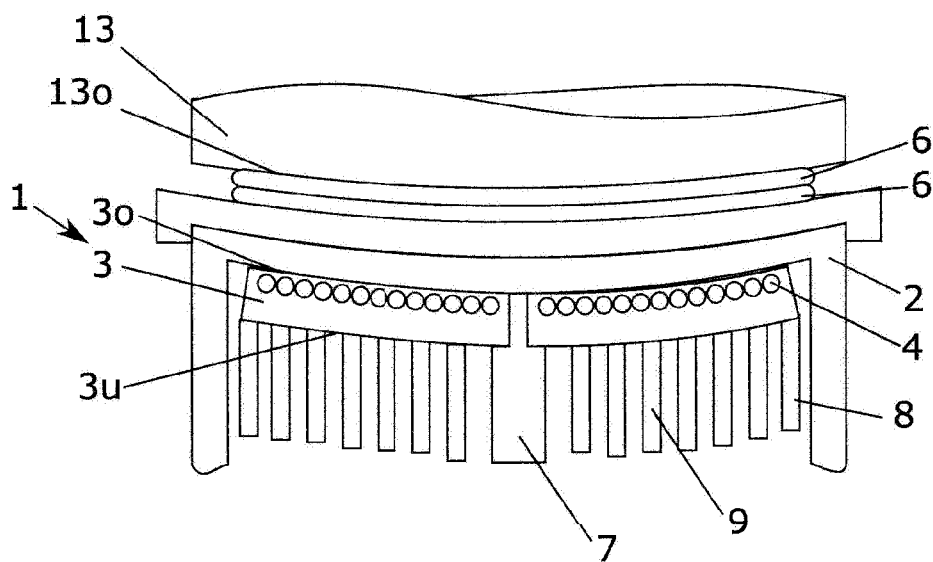
FIG. 1c shows the first embodiment of the apparatus according to the invention in a position under load.

FIG. 1c shows a first embodiment of the apparatus 1 according to the invention in a loaded state. The two substrates 6 are loaded with a force or pressure by a pressure apparatus 13. The pressure apparatus 13 has a desired pressure apparatus surface 13o. The pressure apparatus surface 13o may be flat or convex. Or other shapes are also conceivable. The shape of the pressure apparatus surface 13o is determined on the basis of a number of different reasons. It might conceivably be constructed with a curvature deliberately. It is conceivable that the strong forces of the pressure apparatus 13 cause the deformation. Another possibility might be that the pressure apparatus surface 13o was not created perfectly flat. At all events, the pressure apparatus surface 13o, which may generally have any shape, will act on the substrates 6, the substrate holder 5 positioned below them, and the stage 2 with differing intensity. In the event of a correspondingly substantial deformation, the heater 3 located below them will be deformed as well. In particular, the heater 3 will be deformed together with the other components if there is a mechanical connection between the heater 3 and the stage 2. In this case, the heater 3 undergoes undesirable deformation due to the pressure apparatus 13, and the elements (7, 8, 9 and 11) function to counteract this process, in particular to generate a counteracting force which compensates for the undesirable deformation of the heater 3 as effectively as possible, in particular completely. For the sake of clarity, the deflections and deformations of components 2, 3, 5 and 13 are not illustrated to scale. In practical application, the deflections and deformations are particularly in the nanometre to millimetre range. FIG. 1c in particular represents a deformation state. The person skilled in the field will understand that the desired state is characterized in that the deformation of the components, particularly of the heater 3, is compensated, preferably fully, by the elements (7, 8, 9, 11). The forces that may be exerted by the pressure apparatus 13 are greater than 10N, preferably greater than 500N, more preferably greater than 1000N, particularly preferably greater than 10000N, most preferably greater than 100000N.

In the remaining figures, the substrate holder 5, the substrate 6 and the fluid stream 10 will not be illustrated, since they present no further features that are relevant to the further embodiments of the apparatuses 1,1',1" and 1'".

Figure 2:
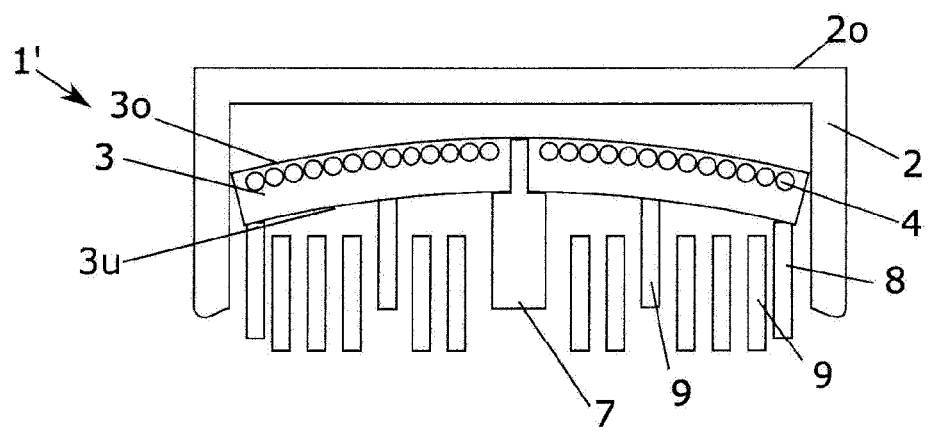
FIG. 2 shows a second embodiment of the apparatus according to the invention.

FIG. 2 shows a second embodiment of the apparatus 1', in which there are deformation elements 8 that are connected to the heater 3 solely at the edge. Other support element 9 are located in particular symmetrically below the heater 3, but they are not connected thereto. The support elements 9 may simultaneously function as braces to support the heater 3 when it is in the unloaded state. Additionally, the support elements 9 are able to apply a locally compressive force but not a tensile force to the heater 3. Otherwise, reference is made to the description of the previous embodiments.

Figure 3:
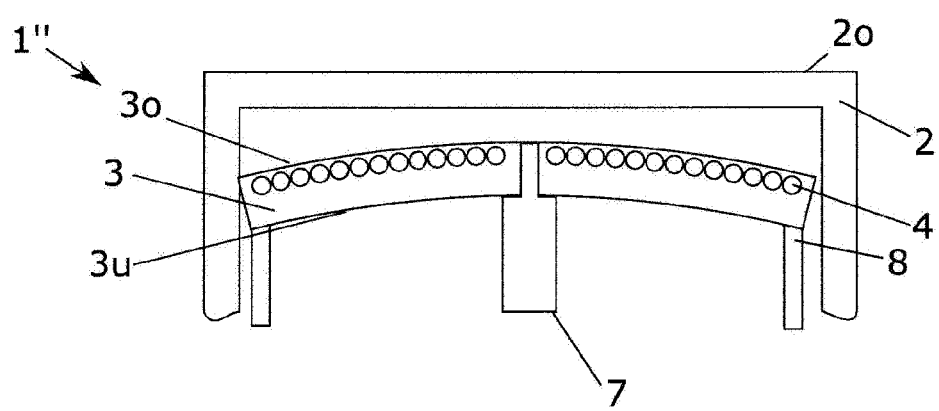
FIG. 3 shows a third embodiment of the apparatus according to the invention.

FIG. 3 shows a third embodiment of the apparatus 1", in which the deformation elements 8 are located only on the edge. The fixing element 7 preferably fixed the heater 3 centrally again. In this way, an embodiment is created that is able to bend the heater 3 symmetrically in the concave and/or convex direction. Otherwise, reference is made to the description of the previous embodiments.

Figure 4:
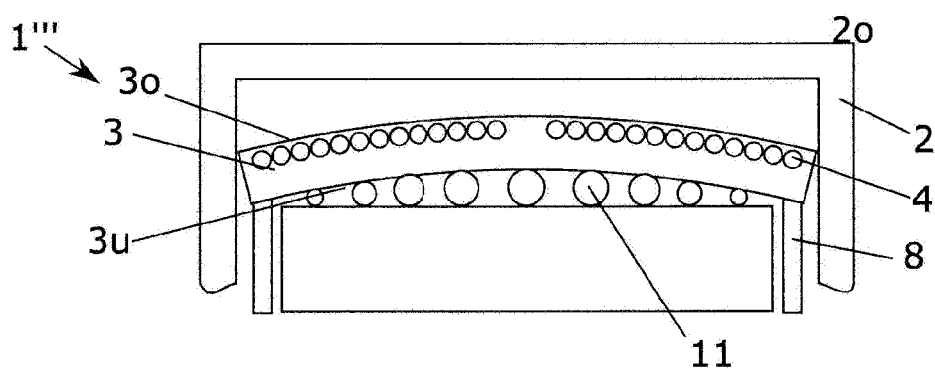
FIG. 4 shows a fourth embodiment of the apparatus according to the invention.

FIG. 4 shows a fourth embodiment of the apparatus 1'", in which limiting elements 11 are used to limit the maximum extent to which the heater 3 is able to bend downwards. In the case illustrated, the limiting elements 11 are spheres whose diameter becomes smaller as a function of the radial position of the sphere. Otherwise, reference is made to the description of the previous embodiments.

LIST OF REFERENCE NUMERALS 1,1',1",1'" Apparatus
2 Stage
2o Stage surface
2i Stage interior surface
3 Heater
3o Heater surface
3u Heater underside
4 Heating elements
5 Substrate holder
5o Substrate holder surface
6 Substrate 6o Substrate surface
7 Fixing element
8 Deformation element
9 Support element
10 Fluid flow
11 Limiting element
12 Open space
13 Pressure apparatus
13o Pressure apparatus surface

What is claimed is:

1. An apparatus for heating a substrate, said apparatus comprising:
   i) a heater;
   ii) a substrate holder having a substrate holder surface, wherein the substrate to be heated can be placed on the substrate holder surface;
   iii) means for exerting forces on the heater; and
   iv) a control unit for controlling the means for exerting forces, wherein the heater is deformable by the means for exerting forces,
   wherein, due to deformation of the heater effected by the means for exerting forces, the deformation of the heater caused by external forces can be offset.

2. The apparatus according to claim 1, wherein due to the deformation of the heater effected by the means for exerting forces, an actual temperature distribution in the substrate is adaptable to a target temperature distribution.

3. The apparatus according to claim 1, wherein the apparatus further comprises:
   at least one deformation element connected to the heater, wherein the at least one deformation element is connected to at least one actuator, so that the heater is deformable in targeted manner.

4. The apparatus according to claim 1, wherein the heater is arranged on a side of the substrate holder surface opposite the substrate.

5. The apparatus according to claim 1, wherein the heater is deformable independently of the substrate holder surface.

6. The apparatus according to claim 1, wherein the apparatus further comprises:
   a stage, wherein the substrate holder is arranged on a stage surface of the stage, and the heater is arranged inside the stage.

7. The apparatus according to claim 1, wherein the heater has a heating element of flat construction or a plurality of heating elements in a flat arrangement.

8. The apparatus according to claim 1, wherein the the means for exerting force includes at least one fixing element, wherein the at least one fixing element is connected to the heater and fixes at least one point of the heater.

9. The apparatus according to claim 1, wherein the means for exerting force includes at least one support element which is not connected to the heater, wherein the at least one support element can only apply pressure to the heater and/or can only limit the deformation of the heater.

10. The apparatus according to claim 1, wherein means for exerting force includes at least one limiting element which is not connected to the heater, wherein the at least one limiting element can limit the deformation of the heater and/or can predefine the deformation through a shape of the limiting element.

11. The apparatus according to claim 1, wherein a fluid stream can be flushed between the heater and other components, in order to optimise transfer of heat between the heater and the other components.

12. The apparatus according to claim 1, wherein the apparatus further comprises:
   a plate, wherein the plate is arranged between the heater and the substrate holder.

13. The apparatus according to claim 1, wherein a fluid stream can be flushed between the heater and a stage and/or between the heater and the substrate holder.

14. An apparatus for processing and/or bonding a substrate, comprising the apparatus according to claim 1.

15. A method for heating a substrate to create a predetermined target temperature distribution in a substrate and/or to offset a deformation of a heater caused by external forces, wherein the heater heats the substrate and a substrate holder holds the substrate in place on a substrate holder surface, said method comprising:
   exerting forces on the heater using means for exerting forces, wherein a control unit controls the means for exerting forces,
   wherein, due to deformation of the heater effected by the means for exerting forces, the deformation of the heater caused by external forces can be offset.

16. The method according to claim 15, further comprising:
   i) positioning and/or fixing the substrate on the substrate holder surface of the substrate holder;
   ii) determining an actual temperature distribution in the substrate; and
   iii) based on an analysis of the actual temperature distribution compared with a target temperature distribution, deforming the heater with the means for exerting forces, wherein the means for exerting forces are controlled by the control unit so that the deformation of the heater has the effect of adjusting the actual temperature distribution of the substrate in a targeted manner to the predefined target temperature distribution.

17. The method according to claim 16, wherein the actual temperature distribution is determined on a substrate surface of the substrate.

18. The method according to claim 15, said method further comprising:
   i) positioning and/or fixing the substrate on the substrate holder surface of the substrate holder;
   ii) determining a deformation of the heater caused by external forces; and
   iii) based on an analysis of the deformation of the heater caused by the external forces, deforming the heater with the means for exerting forces, wherein the means for exerting forces are controlled by the control unit so that the deformation of the heater has the effect of offsetting the deformation of the heater caused by the external forces.

19. The method according to claim 18, wherein the deformation of the heater is determined on a heater surface of the heater.

20. A method for processing and/or bonding a substrate, wherein a substrate is heated according to the method of claim 14.

* * * * *